United States Patent
Zhai (10) Patent No.: US 10,559,766 B2
(45) Date of Patent: Feb. 11, 2020

(54) FLEXIBLE DISPLAY SCREEN AND FLEXIBLE DISPLAY DEVICE

(71) Applicant: SHANGHAI TIANMA MICRO-ELECTRONICS CO., LTD., Shanghai (CN)

(72) Inventor: Yingteng Zhai, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 42 days.

(21) Appl. No.: 15/788,747

(22) Filed: Oct. 19, 2017

(65) Prior Publication Data
US 2018/0040838 A1    Feb. 8, 2018

(30) Foreign Application Priority Data
Apr. 27, 2017    (CN) .......................... 2017 1 0289661

(51) Int. Cl.
*H01L 51/52* (2006.01)
*H01L 27/32* (2006.01)
*H01L 51/00* (2006.01)

(52) U.S. Cl.
CPC ...... *H01L 51/0097* (2013.01); *H01L 27/3246* (2013.01); *H01L 27/3258* (2013.01); *H01L 27/3262* (2013.01); *H01L 27/3276* (2013.01); *H01L 51/5237* (2013.01); *H01L 2251/5338* (2013.01); *Y02E 10/549* (2013.01)

(58) Field of Classification Search
CPC ..... H01L 51/0097; H01L 51/52; H01L 27/32; H01L 27/3276
USPC ........................................................ 257/40
See application file for complete search history.

(56) References Cited

U.S. PATENT DOCUMENTS

| | | | |
|---|---|---|---|
| 9,379,355 B1 | 6/2016 | Lee | |
| 2015/0137102 A1* | 5/2015 | Yang | B32B 37/144 257/40 |
| 2016/0035759 A1* | 2/2016 | Kwon | H01L 27/1244 257/40 |
| 2016/0093685 A1* | 3/2016 | Kwon | H01L 27/3276 257/40 |
| 2016/0181346 A1* | 6/2016 | Kwon | H01L 27/3276 257/40 |
| 2016/0218305 A1* | 7/2016 | Kim | G02F 1/133305 |
| 2016/0380033 A1* | 12/2016 | Lee | H01L 27/323 257/40 |

(Continued)

FOREIGN PATENT DOCUMENTS

| | | |
|---|---|---|
| CN | 103106845 A | 5/2013 |
| CN | 105679790 A | 6/2016 |

(Continued)

*Primary Examiner* — Fazli Erdem
(74) *Attorney, Agent, or Firm* — Kilpatrick Townsend & Stockton, LLP (57) ABSTRACT

The invention relates to the field of display devices, and discloses a flexible display screen and a flexible display device, wherein the flexible display screen includes: a flexible substrate including a functional area in which functional elements are arranged, and a peripheral area around the functional area, wherein the flexible substrate includes at least one bent section; and a support structure arranged in the peripheral area of the flexible substrate, wherein the support structure traverses the bent section, and can be bent or expanded along with the bent section.

17 Claims, 10 Drawing Sheets

(56) References Cited

U.S. PATENT DOCUMENTS

| | | | | |
|---|---|---|---|---|
| 2017/0032737 A1* | 2/2017 | Lee | ............... | G09G 3/3225 |
| 2017/0062742 A1* | 3/2017 | Kim | ............... | H01L 51/0097 |
| 2017/0062760 A1* | 3/2017 | Kim | ............... | H01L 51/5253 |
| 2017/0301267 A1* | 10/2017 | Cai | ............... | G09F 9/301 |
| 2017/0352834 A1* | 12/2017 | Kim | ............... | H01L 27/3276 |
| 2017/0373121 A1* | 12/2017 | Leng | ............... | H01L 27/32 |
| 2018/0090698 A1* | 3/2018 | Jeong | ............... | H01L 27/3276 |
| 2018/0114951 A1* | 4/2018 | Namkung | ............... | H01L 51/0097 |
| 2018/0145124 A1* | 5/2018 | Kim | ............... | H01L 51/5253 |
| 2018/0175311 A1* | 6/2018 | Jin | ............... | H01L 51/0097 |

FOREIGN PATENT DOCUMENTS

| | | |
|---|---|---|
| CN | 105789255 A | 7/2016 |
| CN | 105810103 A | 7/2016 |
| CN | 106449699 A | 2/2017 |
| CN | 106486018 A | 3/2017 |
| CN | 206112430 U | 4/2017 |
| TW | 201701111 A | 1/2017 |

\* cited by examiner

FLEXIBLE DISPLAY SCREEN AND FLEXIBLE DISPLAY DEVICE

CROSS-REFERENCE TO RELATED APPLICATIONS

This application claims the priority to Chinese Patent Application No. 201710289661.4, filed on Apr. 27, 2017, the content of which is hereby incorporated by reference in its entirety.

FIELD

The present invention relates to the field of display devices, and to a flexible display screen and a flexible display device.

BACKGROUND

As there is a growing demand for portable display terminals, and the display technologies are being developed constantly, there are increasingly progressing and intensive researches on the technologies of flexible display screens (soft screens).

At present, the flexible display screens in the market are still predominated by Organic Light-Emitting Diode (OLED) displays and Electrophoresis Displays (EPDs), where products of the EPDs in the market are currently limited to static electronic books due to a low response speed, full-gamut chromatic aberration, and other technical problems thereof; and the existing flexible display products are predominated by the OLEDs due to self-luminescence, a high response speed, a wide angle of view, high definition, high brightness, high breaking strength, low power consumption, and other advantages thereof.

In order to guarantee the bending performance of the existing flexible display screen, there is generally no protecting film layer structure in a bent area thereof, that is, there are only a substrate, and a part of a functional film layer structure in the bent area, so the thickness thereof in the bent area is so small that this area tends to be significantly deformed by an external force, or significantly deformed locally when the flexible display screen is bent, thus easily resulting in a damage to a functional film layer around the bent area, for example, breaking a display functional film layer. Accordingly it has been desirable in the art of flexible display screens to improve the reliability of the flexible display screen being folded.

SUMMARY

In view of this, embodiments of the invention disclose a flexible display screen and a flexible display device so as to improve the reliability of the flexible display screen.

In order to attain the object above, an aspect of the invention provides a flexible display screen including a flexible substrate including a functional area in which functional elements are arranged, and a peripheral area around the functional area, wherein the flexible substrate includes at least one bent section, a support structure arranged in the peripheral area of the flexible substrate, wherein the support structure traverses the bent section, and can be bent or expanded along with the bent section.

Another aspect of the invention further provides a flexible display device including the flexible display screen above.

In the flexible display screen and the flexible display device above according to some embodiments of the invention, the flexible display screen is arranged therein with the support structure across the bent section of the flexible substrate, where the support structure can support the flexible substrate, so that the bent section of the flexible substrate can be deformed uniformly and moderately while the flexible substrate is being folded and expanded, to thereby avoid the functional film layer from being damaged, or the flexible substrate from being broken due to the significant local deformation of the bent section of the flexible substrate; secondly the support structure above can further enhance the restorability of the bent section of the flexible substrate after being deformed, so as to avoid the flexible display screen from failing to be expanded, etc., due to the elastic fatigue of the flexible substrate; and thirdly the support structure above may not limit the bending curvature radius of the bent section of the flexible substrate, so the bending curvature radius of the flexible display screen can be adjusted and varied as needed for its user, and the support structure above can be designed in a very small volume to thereby well facilitate a miniaturized and thinned design of the flexible display screen. Moreover the support structure above can be located on the side of the flexible substrate on which the functional film layer is formed, or can be located on the side of the flexible substrate away from the functional film layer, and the display function of the flexible display screen may not be affected no matter on which side of the flexible substrate the support structure is arranged. Accordingly in summary, the flexible display screen of the flexible display device above has good bending performance, is highly reliable, is not easy to damage, has a longer service lifetime, is convenient to design in a miniaturized pattern, and is convenient to carry, so the display device above is highly reliable, has a longer service lifetime, is convenient to design in a miniaturized pattern, and is convenient to carry.

DETAILED DESCRIPTION OF THE EMBODIMENTS

Figure 1:
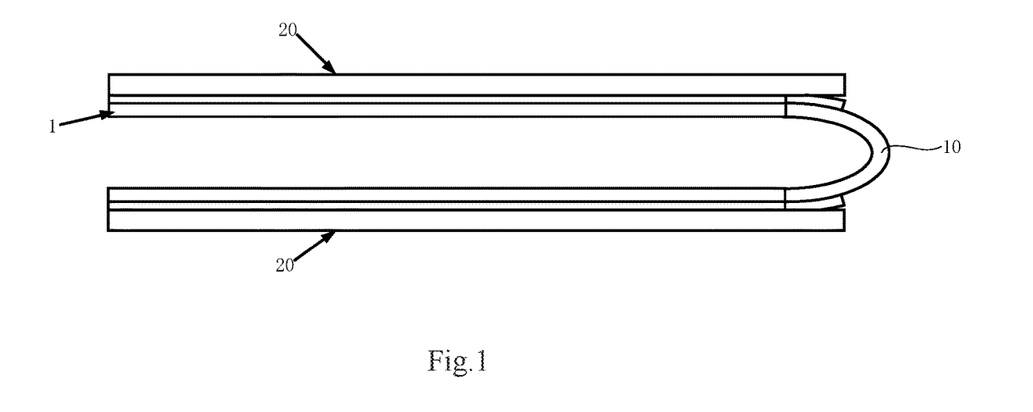
FIG. 1 is a schematic structural diagram of a flexible display screen in the prior art.

FIG. 1 is a schematic structural diagram of a foldable and flexible display screen in the prior art; and as illustrated in FIG. 1, protecting layers 20 are arranged in two folded areas of a flexible substrate 1 of the flexible display screen to prevent the flexible display screen from being bent in the two folded areas, or a functional film layer in the folded areas from being damaged; and in order to avoid a bent section 10 of the flexible substrate 1 from being folded uneasily due to a too thick film layer in a bent area of the flexible substrate 1, the structure of the protecting layers 20 is not arranged on the bent section 10 of the flexible substrate 1, that is, only the functional film layer for a display function of the flexible display screen is arranged on the bent section 10 of the flexible substrate 1. However since there is only the two-layer structure of the flexible substrate 1 and the functional film layer in the bent area of the flexible display screen, the structural layer thereof is very thin and less flexible, the bending curvature radius of the bent section 10 of the flexible substrate 1, or a part of the bent section 10 tends to be too small while the flexible display screen is being folded, so that the bent section 10 of the flexible substrate 1, or a part of the bent section 10 is over-deformed, thus damaging or breaking the functional film layer in or around the bent area of the flexible display screen due to an excessive stress thereon.

Figure 2:
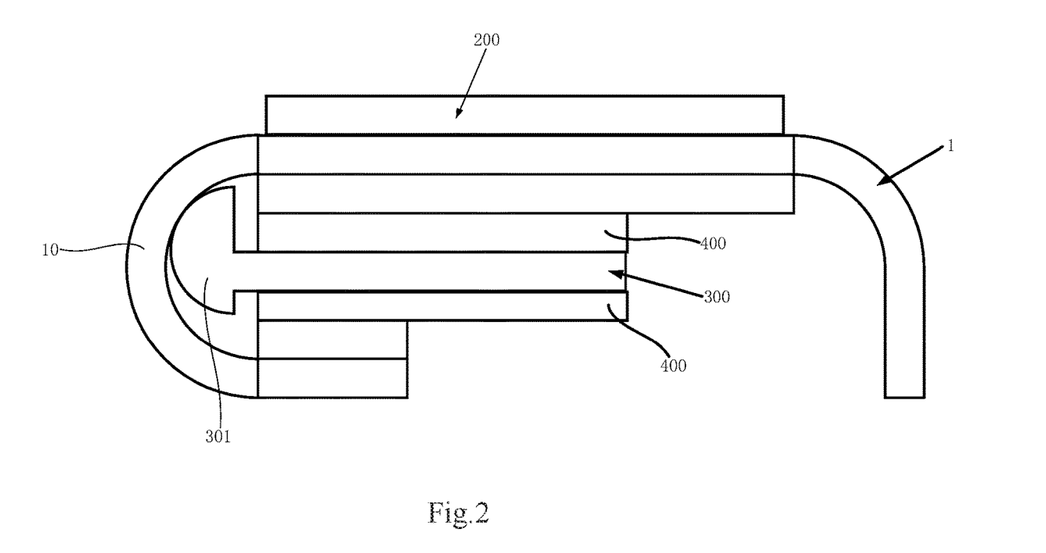
FIG. 2 is a schematic structural diagram of another flexible display screen in the prior art.

FIG. 2 is a schematic structural diagram of another flexible display screen in the prior art; and as illustrated in FIG. 2, a flexible substrate 1 of the flexible display screen includes a display area component, and a flexible circuit board wiring area component bent to the backside of the flexible substrate; and in the flexible display screen, there is a support body 300 arranged between the two folded components of the flexible substrate 1 (i.e., the display area component and the flexible circuit board wiring area component), where the support body 300 is generally plate-like, and arranged parallel to the two folded components of the flexible substrate 1. In one embodiment, a support section 301 is arranged on the edge at the side of the support body 300 facing the bent section 10 of the flexible substrate 1, where the cross section of the support section 301 is semi-circular, and the support section 301 abuts against the bent section 10 of the flexible substrate 1 to prevent the bending curvature radius of the bent section 10 of the flexible substrate 1 from being too small, and furthermore to avoid the bent section 10 of the flexible substrate 1, or a part of the bent section 10 from being over-deformed, which would otherwise damage or break a functional film layer 200 in or around the bent area of the flexible display screen. Moreover in the flexible display screen above, the sides of the two folded components of the flexible substrate 1 facing the support body 300 are bonded to the support body 300 through a bonding layer 400 to thereby be folded and fixed thereon; and in the flexible display screen above, although the support section 301 of the support body 300 can avoid the bending curvature radius of the bent section 10 of the flexible substrate 1 from being too small, and furthermore the film layer from being damaged due to the excessive deformation of the bent section 10, the flexible display screen may still suffer from a number of drawbacks. For example, firstly since the size of the radius of the support body 301 is fixed, the bending curvature radius of the bent section 10 of the flexible display screen including the support body 300 is also fixed, and thus cannot be varied as needed; and secondly the overall volume of the support body 300 is very large, and it is difficult to miniaturize the support body, so the overall thickness and volume of the flexible display screen may be significantly increased due to the support body 300, thus hindering the flexible display screen from being miniaturized. Moreover in order to avoid the functional film layer 200 on the flexible substrate 1 from being damaged while the bent section 10 of the flexible substrate 1 is being supported, the support body 300 can only be arranged on the side of the flexible substrate 1 away from the functional film layer 200, that is, the flexible display screen above can only be folded to the side of the flexible substrate 1 away from the functional film layer 200, which may hinder the screen of the flexible display screen from being protected, and the flexible display screen from being carried by a user with himself or herself.

In view of this, embodiments of the invention provide a flexible display screen and a flexible display device so as to improve the reliability of the flexible display screen being bent.

A flexible display screen according to some embodiments of the invention includes following elements.

A flexible substrate including a functional area in which functional elements are arranged, and a peripheral area around the functional area, where the flexible substrate includes at least one bent section;

A support structure arranged in the peripheral area of the flexible substrate, where the support structure traverses the bent section, and can be bent or expanded along with the bent section.

In the flexible display screen, the support structure is arranged on the flexible substrate, where the support structure traverses the bent section, and can be bent or expanded along with the bent section, so the support structure can support the bent section of the flexible substrate to thereby enhance the flexibility of the bent component of the flexible display screen so that the bent section of the flexible substrate can be deformed uniformly and moderately at a bending curvature radius which is not too small instead of being significantly deformed locally while the flexible display screen is being folded, to thereby avoid the bent section of the flexible substrate, and a functional film layer nearby from being damaged due to an excessive stress thereon.

Secondly as compared with the support body of the flexible display screen in FIG. 2, the support structure in the flexible display screen above can prevent the bending curvature of the bent section of the flexible substrate from being too small, but also can enhance the restorability of the bent section of the flexible substrate after being deformed, so as to avoid the flexible display screen from failing to be expanded, etc., due to the elastic fatigue of the flexible substrate.

Thirdly since the support structure above is arranged across the bent section of the flexible substrate, and can be bent or expanded along with the bent section traversed by the support structure, although the support structure can support the bent section of the flexible substrate, the bending performance of the flexible substrate itself may not be affected, and the bending curvature radius of the bent section of the flexible substrate may not be defined directly, so the bending curvature radius of the flexible display screen above can be adjusted and varied as needed for the user.

Moreover since the support structure is located only in the peripheral area of the flexible substrate as long as it traverses the bent section of the flexible substrate, and also the support structure can be designed in a very small volume substantially without any influence upon the overall volume and thickness of the flexible display screen, so the support structure above can well facilitate a miniaturized design of the flexible display screen.

Furthermore since the support structure is located in the peripheral area of the flexible substrate, that is, spaced from the functional film layer in the functional area of the flexible substrate, the support structure may not result in a too thick stack of layers in the function area of the flexible substrate, and the functional film layer can be avoided from being damaged due to an acting stress on the edge of the support structure.

Additionally since the support structure is located only in the peripheral area of the flexible substrate, the support structure can be located on the side of the flexible substrate on which the functional film layer is formed, or can be located on the side of the flexible substrate away from the functional film layer, and the functional film layer in the functional area of the flexible substrate will not be damaged no matter on which side of the flexible substrate the support structure is arranged; and the support substructure will not limit the bending direction of the flexible display screen, that is, the flexible display screen can be bent to the light exit side thereof, or can be bent to the backside thereof, and the support structure can well support the bent section of the flexible substrate without affecting the display function of the flexible display screen no matter to which side thereof the flexible display screen is bent.

The technical solution according to some embodiments of the invention may be described below clearly and fully with reference to the drawings in some embodiments of the invention, and apparently some embodiments to be described below are only a part but not all of the embodiments of the invention. Based upon some embodiments here of the invention, all the other embodiments which can occur to those ordinarily skilled in the art without any inventive idea might fall into the scope of the invention as claimed.

Reference may be made to FIG. 3 to FIG. 18.

Figure 3:
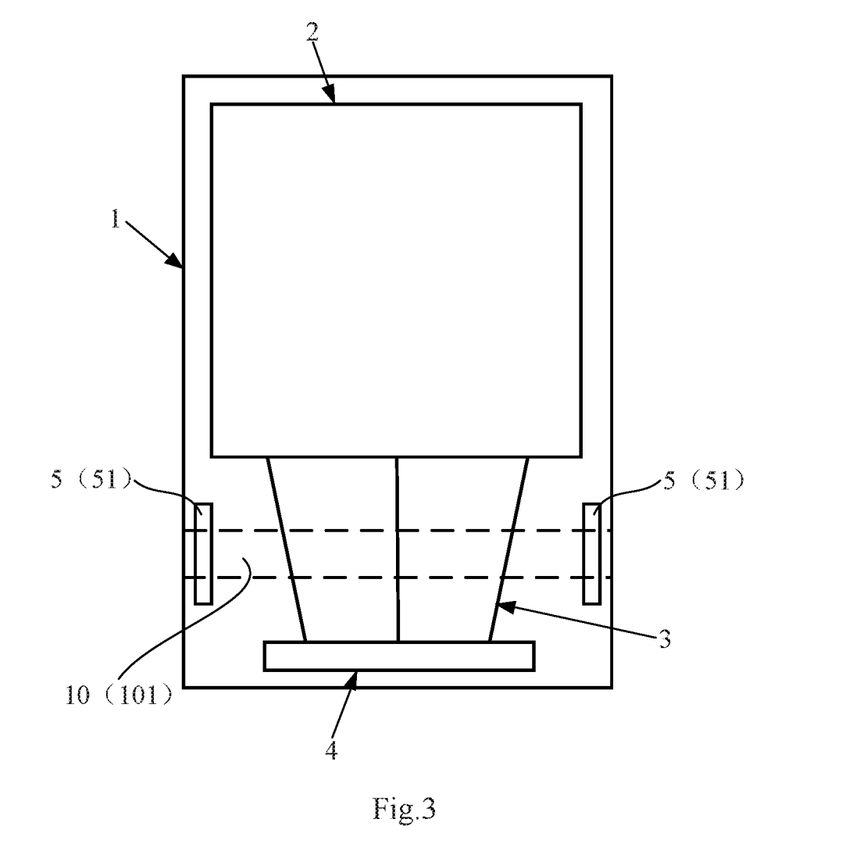
FIG. 3 is a schematic structural diagram of a flexible display screen according to some embodiments of the invention.
Figure 4:
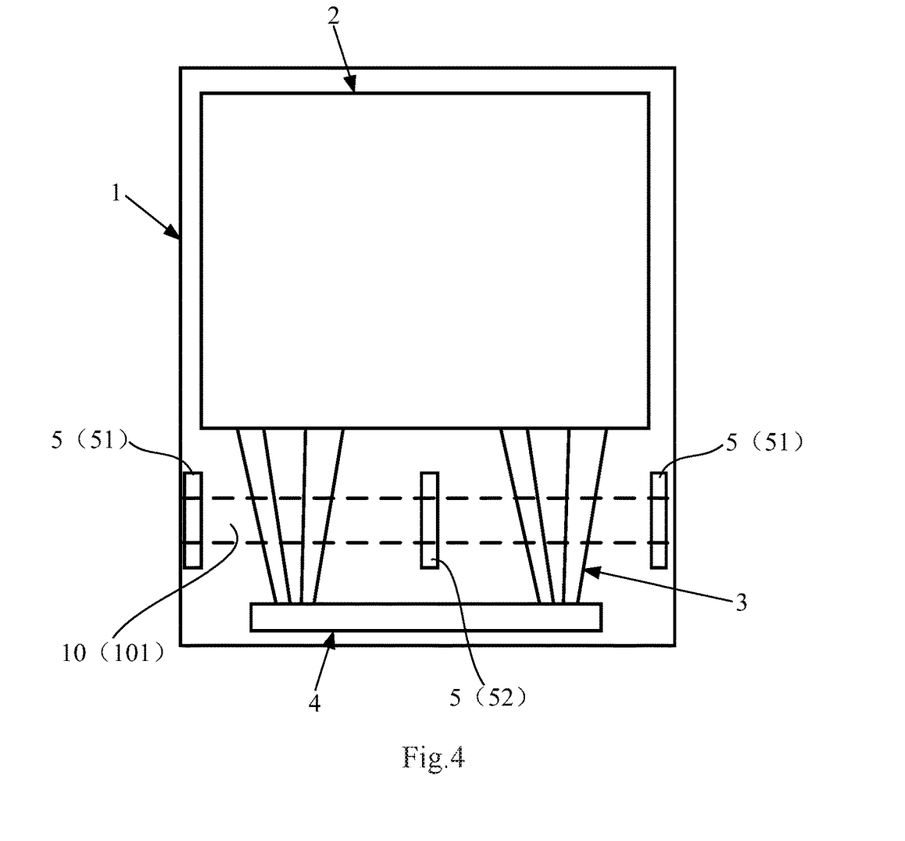
FIG. 4 is a schematic structural diagram of a flexible display screen according to another embodiment of the invention.
Figure 5:
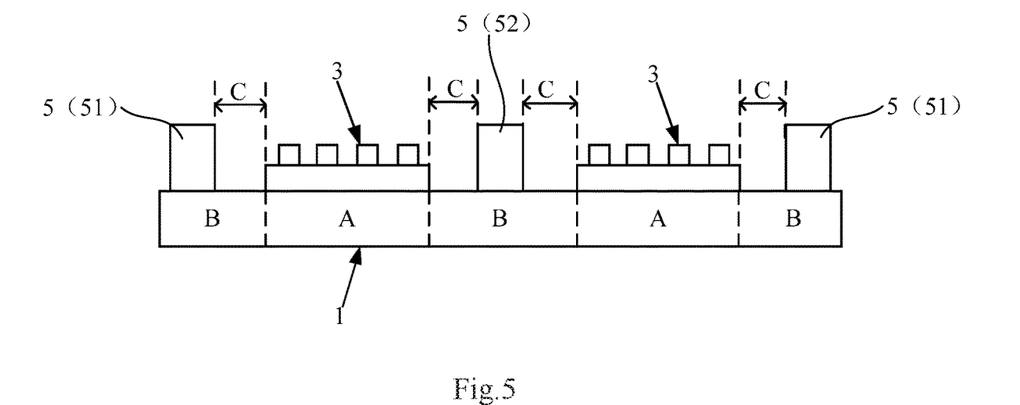
FIG. 5 is a schematic structural diagram of a cross section of the flexible display screen in FIG. 4 in the extension direction of a first bent section.
Figure 6:
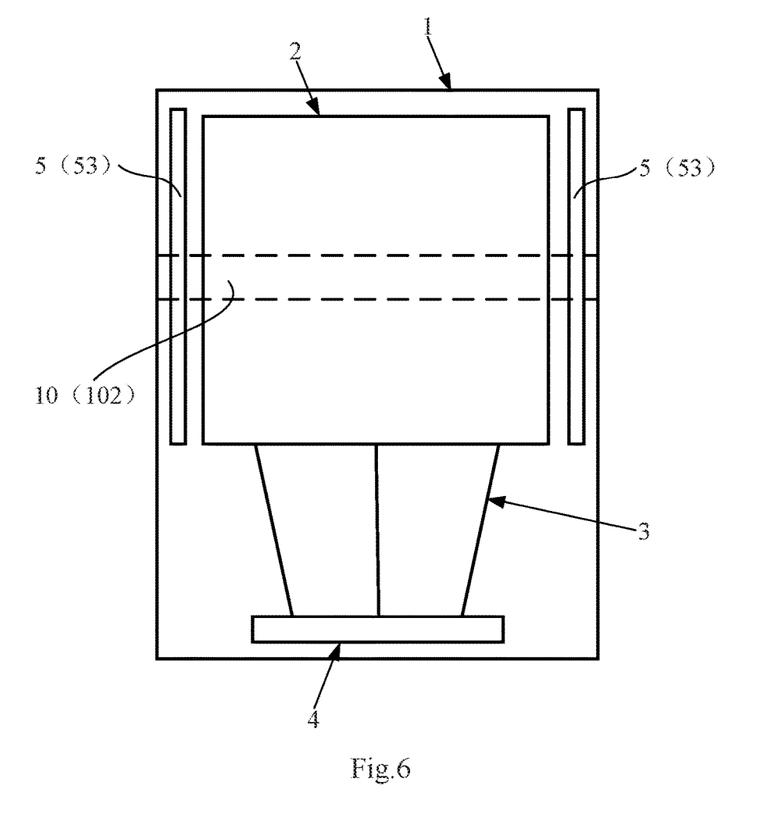
FIG. 6 is a schematic structural diagram of a flexible display screen according to another embodiment of the invention.
Figure 7:
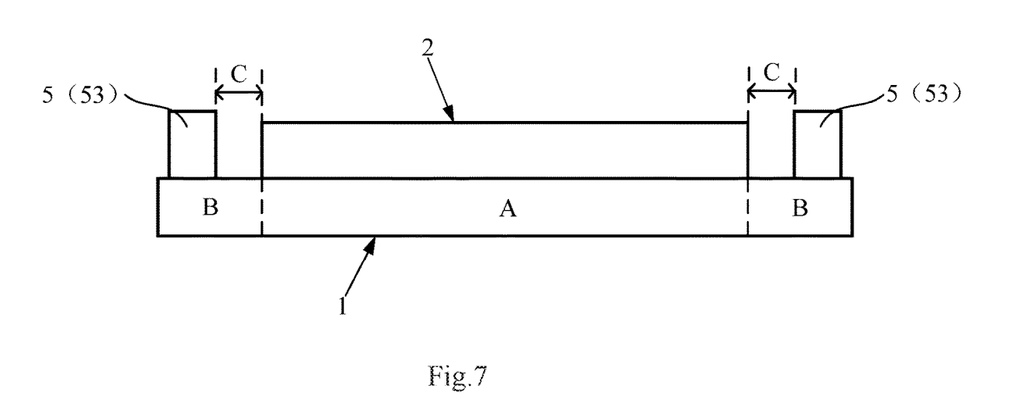
FIG. 7 is a schematic structural diagram of a cross section of the flexible display screen in FIG. 6 in the extension direction of a second bent section.
Figure 8:
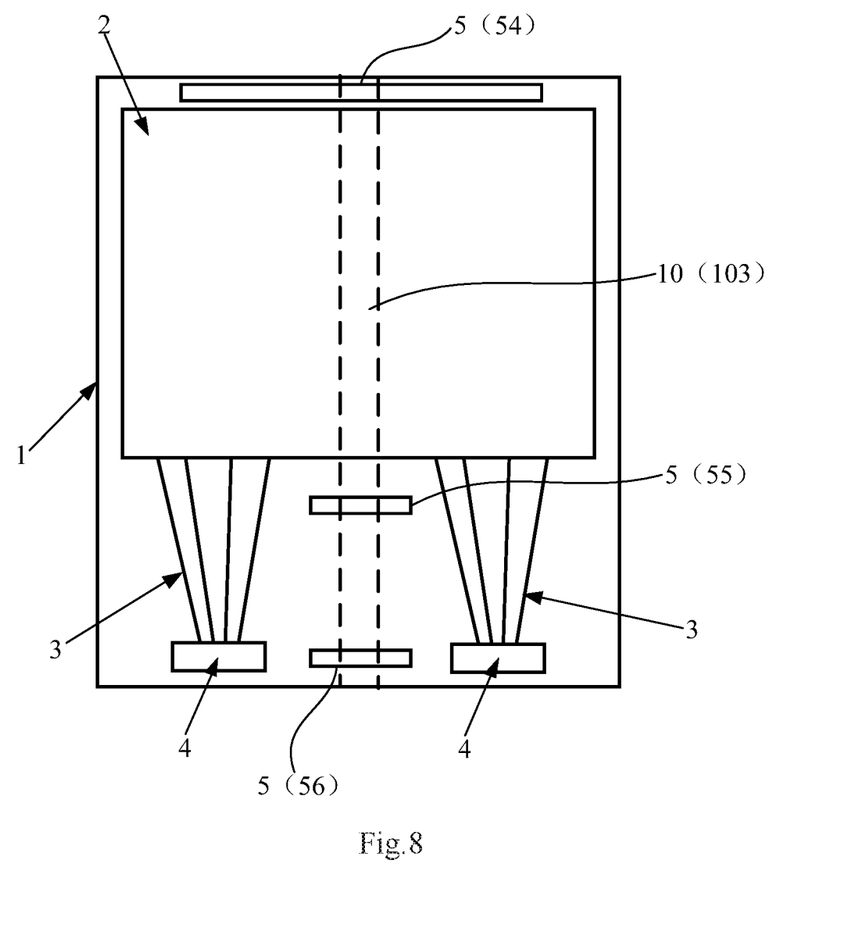
FIG. 8 is a schematic structural diagram of a flexible display screen according to another embodiment of the invention.

As illustrated in FIG. 3 to FIG. 9, a flexible display screen according to some embodiments of the invention includes a flexible substrate 1, and a support structure 5 arranged on the flexible substrate 1; and the flexible substrate 1 includes a functional area A and a peripheral area B, where the functional area A is an area in which functional elements of the flexible display screen are arranged, for example, an area on the flexible substrate 1 in which a display function film layer 2, metal wiring 3, and other functional element film layers (simply "functional film layers" hereinafter) are arranged, and the peripheral area B is located around the functional area, and can also be referred to as a non-functional area, for example, an edge area surrounding the functional area and the flexible substrate 1 includes at least one bent section 10, i.e., a deformed strip-like section of the flexible substrate 1 being folded (a section surrounded by a dotted line as illustrated in FIG. 3, FIG. 4. FIG. 6, and FIG. 8).

The support structure 5 is arranged in the peripheral area of the flexible substrate 1 across the bent section 10 of the flexible substrate 1, that is, the support structure 5 is arranged intersecting with the bent section 10 of the flexible substrate 1, and the support structure 5 can be bent or expanded along with the bent section 10 intersecting therewith.

In the flexible display screen, the support structure 5 is arranged on the flexible substrate 1 across the bent section 10 of the flexible substrate 1 so that the support structure 5 can be bent or expanded along with the bent section 10 of the flexible substrate 1; and since the support structure 5 can support the flexible substrate 1, the bent section 10 of the flexible substrate 1 may be deformed uniformly and moderately instead of being significantly deformed locally while the flexible display screen is being folded, to thereby avoid the bent section 10 of the flexible substrate 1, and the functional film layers nearby from being damaged; and since the support structure 5 is located in the peripheral area B of the flexible substrate 1, that is, spaced from the functional film layers in the functional area A of the flexible substrate 1, the support structure 5 may not result in a too thick stack of the layers in the function area A of the flexible substrate 1, and since the material of the support structure 5 can enable the support structure 5 to be bent and expanded freely along with the bent section 10 of the flexible substrate 1, the support structure 5 can avoid the bending performance of the flexible substrate from being affected.

In the flexible display screen above, the support structure 5 is arranged on the flexible substrate 1 across the bent section 10 of the flexible substrate 1 so that the support structure 5 can be bent or expanded along with the bent section 10 of the flexible substrate 1, so the support structure 5 can support the bent section 10 of the flexible substrate 1 to thereby enhance the flexibility of the bent component of the flexible display screen so that the bent section 10 of the flexible substrate 1 can be deformed uniformly and moderately at a bending curvature radius which is not too small instead of being significantly deformed locally while the flexible display screen is being folded, to thereby avoid the bent section 10 of the flexible substrate 1, and the functional film layers nearby from being damaged due to an excessive stress thereon.

Secondly as compared with the support body of the flexible display screen in FIG. 2, the support structure 5 in the flexible display screen above can prevent the bending curvature of the bent section 10 of the flexible substrate 1 from being too small, but also can enhance the restorability of the bent section 10 of the flexible substrate 1 after being deformed, so as to avoid the flexible display screen from failing to be expanded, etc., due to the elastic fatigue of the flexible substrate 1.

Thirdly since the support structure 5 is arranged across the bent section 10 of the flexible substrate 1, and can be bent or expanded along with the bent section 10 traversed by the support structure, although the support structure 5 can support the bent section 10 of the flexible substrate 1, the bending performance of the flexible substrate 1 itself may not be affected, and the bending curvature radius of the bent section 10 of the flexible substrate 1 may not be defined directly, so the bending curvature radius of the flexible display screen above can be adjusted and varied as needed for the user.

Moreover since the support structure 5 is located only in the peripheral area B of the flexible substrate 1 as long as it traverses the bent section 10 of the flexible substrate 1, and also the support structure 5 can be designed in a very small volume substantially without any influence upon the overall volume and thickness of the flexible display screen, so the support structure 5 can well facilitate a miniaturized design of the flexible display screen.

Furthermore since the support structure 5 is located in the peripheral area B of the flexible substrate 1, that is, spaced from the functional film layers in the functional area A of the flexible substrate 1, the support structure 5 may not result in a too thick stack of the layers in the function area A of the flexible substrate 1, and the functional film layer can be avoided from being damaged due to an acting stress on the edge of the support structure 5.

Additionally since the support structure 5 is located in the peripheral area B of the flexible substrate 1, the support structure 5 can be located on the side of the flexible substrate 1 on which the functional film layers are formed, or can be located on the side of the flexible substrate 1 away from the functional film layers, and the functional film layers in the functional area A of the flexible substrate A may not be damaged no matter on which side of the flexible substrate 1 the support structure 5 is arranged; and the support substructure 5 may not limit the bending direction of the flexible display screen, that is, the flexible display screen can be bent to the light exit side thereof, or can be bent to the backside thereof, and the support structure 5 can well support the bent section 10 of the flexible substrate 1 without affecting the display function of the flexible display screen no matter to which side thereof the flexible display screen is bent.

As illustrated in FIG. 5 and FIG. 7, in the flexible display screen according to a particular embodiment of the invention, there may be an isolation area C, in which no inorganic film layer is arranged, arranged between the support structure 5 and the functional area A.

A functional film layer of the flexible display screen generally includes an inorganic film layer, for example, the display function film layer 2 generally includes silicon nitride, silicon oxide, and other inorganic film layers; the inorganic film layer tends to be broken due to an excessive force thereon; and in the flexible display screen according to the embodiment of the invention, the isolation area C is arranged between the support structure 5 and the functional area A, that is, the support structure 5 is isolated from the inorganic film layer in the functional area A, so that the inorganic film layer in the functional area A can be avoided from being broken due to the deformation of the support structure 5, and furthermore the functional layer film can be avoided from damaged, or losing its original function.

As illustrated in FIG. 5 and FIG. 7, in one embodiment there is not any film layer arranged in the isolation area C, that is, neither an inorganic film layer nor an organic film layer, but only the structure of the flexible structure 1 is arranged therein, so that the support structure 5 can be isolated completely from the inorganic film layer in the functional area A, and furthermore the influence of the support structure 5 upon the functional elements of the flexible display screen can be minimized.

As illustrated in FIG. 3 to FIG. 9, further to the embodiment above, in a particular embodiment, the functional area A can include a display area in which the display function film layer 2 is arranged, a wiring area in which the metal wiring 3 is arranged, and a flexible circuit board wire soldering area in which the flexible circuit board wiring 4 is arranged.

As illustrated in FIG. 3, FIG. 4. FIG. 6, and FIG. 8, furthermore the wiring area is located between the display area and the flexible circuit board wire soldering area, and the metal wiring 3 is arranged therein to connect the display function film layer 2 with the flexible circuit board wiring 4.

Further to the embodiment above, as illustrated in FIG. 3 to FIG. 5, in a particular embodiment, the flexible substrate 1 can include a first bent section 101 located between the display area and the flexible circuit board wire soldering area, and running through the wiring area, and at this time, the support structure 5 can include at least two first support bodies 51 located respectively on two sides of the wiring area in the extension direction of the first bent section 101, where each support body 51 traverses the first bent section 101 of the flexible substrate 1, and can be bent or expanded along with the first bent section 10.

The two first support bodies 51 can be bent or expanded along with the first bent section 101 of the flexible substrate 1, and support the first bent section 10, so that the functional film layer nearby the first bent section 101 (e.g., the metal wiring 3) can be avoided from being damaged due to the excessive deformation of the first bent section 101.

As illustrated in FIG. 4 and FIG. 5, further to the embodiment above, furthermore the wiring area can further include at least two sub-wiring areas arranged in sequence in the extension direction of the first bent section 101; and there are at least two metal wires 3 arranged in each sub-wiring area, that is, an area covered by every two or more adjacent metal wires 3 is defined as a sub-wiring area. At this time, the support structure 5 can further include at least one second support body 52 located between the sub-wiring areas, and each second support body 52 traverses the first bent section 101 of the flexible substrate 1, and can be bent or expanded along with the first bent section 101; and there may be one second support body 52 arranged between every two adjacent sub-wiring areas.

The second support body 52 is arranged between the sub-wiring areas, and traverses the first bent section 101 to thereby support a middle part of the first bent section 101, and furthermore avoid the functional layer nearby the middle part of the first bent section 101 (e.g., the metal wires 3 in the middle area) from being damaged due to the excessive deformation of the middle part; and the second support 52 can be additionally arranged to thereby enable a stress, in the extension direction of the first bent section 101 being bent, to be distributed more uniformly, and also the first bent section 101 to be deformed more uniformly so as to further avoid the first bent section 101 from being significantly deformed locally, thus further guaranteeing the stability and reliability of the flexible substrate 1 being bent.

As illustrated in FIG. 6 and FIG. 7, in another particular embodiment, the flexible substrate can include a second bent section 102 running through the display area; and at this time, the support structure 5 can include a third support body 53 arranged on the edge of the display area, and traversing the second bent section 102.

The third support 53 can be bent or expanded along with the second bent section 102 of the flexible substrate 1, and support the second bent section 102, so that the functional film layer nearby the second bent section 102 (e.g., the display functional film layer 2 in the display area) can be avoided from being damaged due to the excessive deformation of the second bent section 102.

In one embodiment, in the flexible display screen according to the embodiment of the invention, the flexible substrate 1 can include only the first bent section 101 or only the second bent section 102, or can include both the first bent section 101 and the second bent section 102, and the numbers of first bent sections 101 and of second bent sections 102 can be determined as needed in practice.

Figure 9:
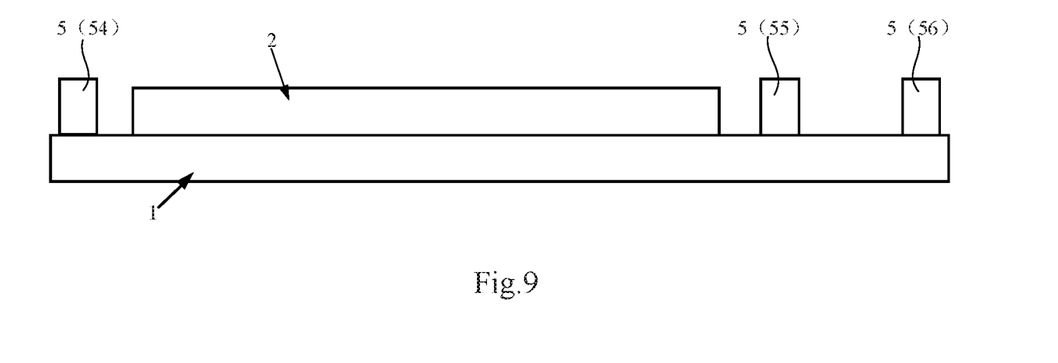
FIG. 9 is a schematic structural diagram of a cross section of the flexible display screen in FIG. 8 in the extension direction of a third bent section.

As illustrated in FIG. 8 and FIG. 9, in another particular embodiment, the flexible substrate 1 can further include a third bent section 103 running through both the display area and the wiring area.

In one embodiment, at this time the wiring area can include at least two sub-wiring areas; and correspondingly the flexible circuit board wire soldering area can include at least two sub-flexible circuit board wire soldering areas corresponding respectively to the sub-wiring areas.

Furthermore the third bent section 103 runs through between the two sub-wiring areas, and between the two sub-flexible circuit board wire soldering areas corresponding to the two sub-wiring areas, where the third bent section 103 can obviate the metal wires 3 in the wiring area, and the flexible circuit board wiring 4 in the flexible circuit board wire soldering area to thereby avoid the third bent section 103 from being bent uneasily, or failing to be bent due to the excessive flexibility of the metal wires 3, the flexible circuit board wiring 4, and the other functional film layers.

As illustrated in FIG. 8 and FIG. 9, further to the embodiment above, in a particular embodiment, at this time the support structure 5 can include a fourth support body 54 arranged on the edge at the side of the display area of the flexible substrate 1 away from the wiring area, and traversing the third bent section 103 of the flexible substrate 1.

Furthermore the support structure 5 can further include a fifth support body 55 arranged between the two sub-wiring areas, and traversing the third bent section 103.

Of course, the support structure 5 can further include a sixth support body 56 arranged between the two sub-flexible circuit board wire soldering areas, and traversing the third bent section 103.

The fourth support body 54, the fifth support body 55, and the sixth support body 56 can be bent or expanded together with the third bent section 103 of the flexible substrate 1, and support the third bent section 103 to thereby avoid the functional film layer nearby the third bent section 103 from being damaged due to the excessive deformation of the third bent section 103.

Moreover since the fourth support body 54, the fifth support body 55, and the sixth support body 56 are arranged in the extension direction of the third bent section 103, and spaced from each other by some distance, to thereby enable a stress, in the extension direction of the third bent section 103 being bent, to be distributed more uniformly, and also the third bent section 103 to be deformed more uniformly so as to further avoid the third bent section 103 from being significantly deformed locally, thus further guaranteeing the stability and reliability of the flexible substrate 1 being bent.

Further to the respective embodiments above, in a particular embodiment, the flexible display screen according to the embodiment of the invention can be a flexible liquid crystal display screen, an Active Matrix Organic Light-Emitting Diode (AMOLED) display screen, a Passive Matrix Organic Light-Emitting Diode (PMOLED) display screen, or an electronic paper display screen.

Figure 10:
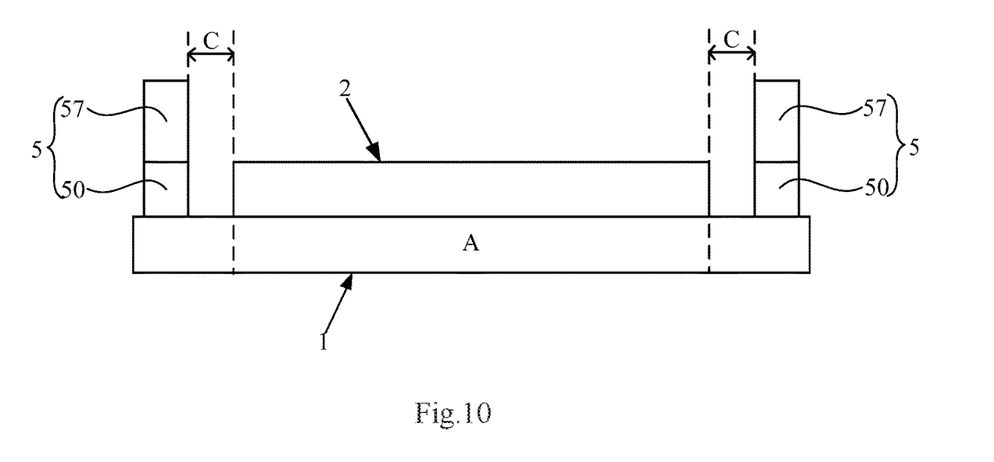
FIG. 10 is a schematic structural diagram of a cross section of a flexible display screen according to another embodiment of the invention in the extension direction of a bent section.
Figure 11:
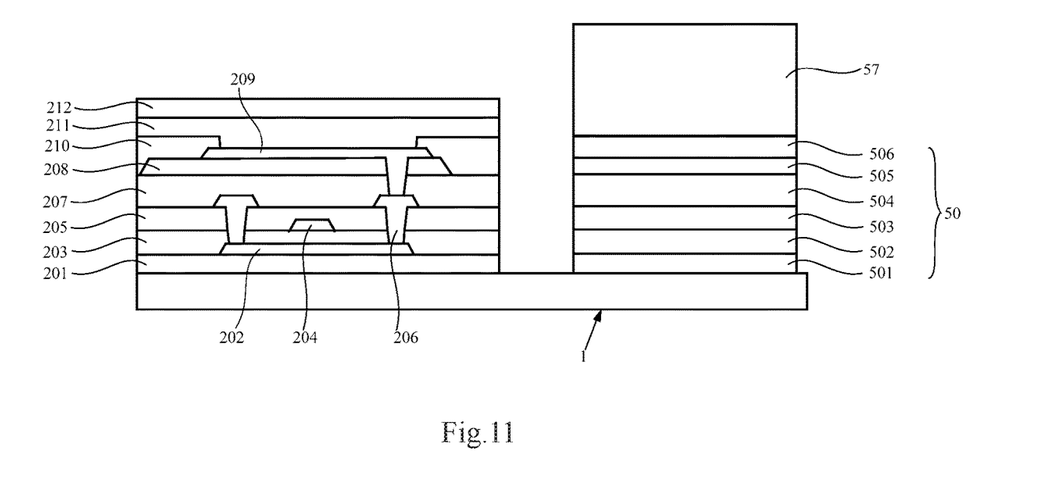
FIG. 11 is a schematic structural diagram of a part of a cross section of a flexible display screen according to another embodiment of the invention in the extension direction of a bent section.
Figure 12:
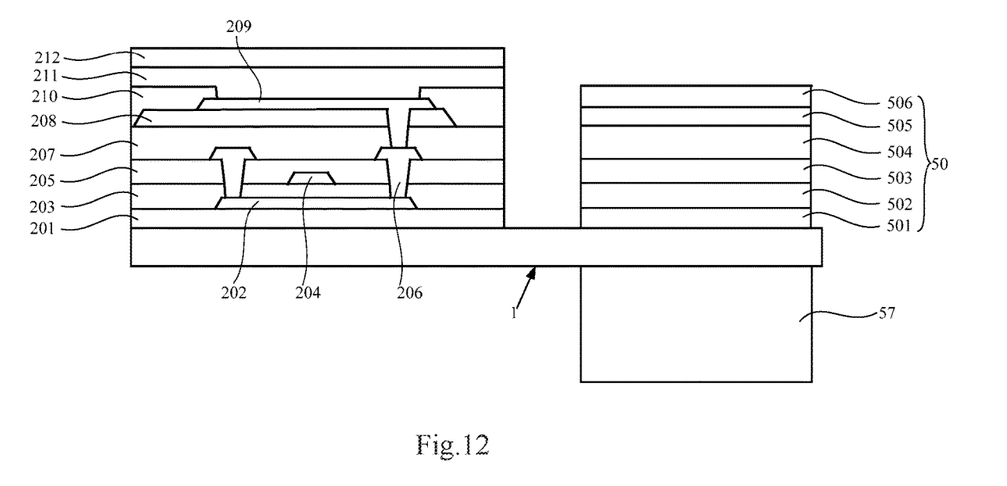
FIG. 12 is a schematic structural diagram of a part of a cross section of a flexible display screen according to another embodiment of the invention in the extension direction of a bent section.

As illustrated in FIG. 10 to FIG. 12, further to some embodiments above, furthermore the support structure 5 can include at least one film layer 50 generated at the same time as the functional film layers of the flexible display screen, and the film layer 50 can be an organic film layer generated at the same time as the organic film layer in the display functional film layer 2.

In one embodiment, as illustrated in FIG. 10, since the film layer 50 is included in the support structure 5, and there is the isolation area C between the support structure 5 and the functional area A, the isolation area C exists between the film layer 50 and the functional film layer; and the film layer 50 and the functional film layers can be fabricated by firstly forming the resulting film layer structure including the film layer 50 and the functional film layers on the flexible substrate 1 in a film plating process, and then forming the isolation area C in an etching process, thus forming the film layer 50 and the functional film layers isolated from each other as a result.

By was of an example in which the flexible display screen according to the embodiment of the invention is an Organic Light-Emitting Diode (OLED) display screen driven by oxide Thin Film Transistors (TFTs), at this time as illustrated in FIG. 11 and FIG. 12, in the flexible display screen according to the embodiment of the invention, the display functional film layer 2 can include one or more of a buffer layer 201, an active layer 202, a gate insulation layer 203, a gate layer 204, an interlayer insulation layer 205, a source-drain electrode layer 206, a planarization layer 207, a passivation layer 208, an anode layer 209, a pixel definition layer 210, an organic light-emitting diode layer 211, and a thin film encapsulation layer 212; and the support structure 5 can include a film layer generated together with one or more of the buffer layer 201, the gate insulation layer 203, the interlayer insulation layer 205, the planarization layer 207, the passivation layer 208, the pixel definition layer 210, and the thin film encapsulation layer 212. For example, the support structure 5 can include a first film layer 601 generated at the same time as the buffer layer 201, a second film layer 502 generated at the same time as the gate insulation layer 203, a third film layer 503 generated at the same time as the interlayer insulation layer 205, a fourth film layer 504 generated at the same time as the planarization layer 207, a fifth film layer 505 generated at the same time as the passivation layer 208, and a sixth film layer 506 generated at the same time as the pixel definition layer 210.

Of course, the display function film layer 2 in the flexible display screen according to the embodiment of the invention may not be limited to the particular structure above; for example, the flexible display screen according to the embodiment of the invention can be structurally driven by Low Temperature Poly-Silicon (LTPS) oxide Thin Film Transistors (TFTs), or can be driven by Amorphic-Silicon (A-Si) oxide Thin Film Transistors (TFTs), and correspondingly the film layer 50 of the support structure 5 can also vary in structure with the varying particular structure of the functional film layers of the flexible display screen.

As illustrated in FIG. 10 to FIG. 12, further to some embodiments above, furthermore the support structure 5 can further include an assisting support body 57 stacked on the film layer 50 in addition to the film layer 50 generated at the same time as the functional film layers.

The support structure 5 including both the film layer 50 and the assisting support body 57 is highly flexible, and furthermore the support structure 5 can well support the flexible display screen; and the assisting support body 57 of the support structure 5 can be bonded onto the film layer 50, where as compared with the support body being bonded directly onto the flexible substrate 1, the connection between the assisting support body 57 of the support structure 5, and the flexible substrate 1 is more stable and reliable, and the assisting support body 57 can be made at a small thickness to thereby conserve a raw material thereof and lower a fabrication cost thereof. Moreover since the film layer 50 is formed at the same time as the functional film layers, that is, the film layer and the functional film layers can be formed in the same film plating process without any additional fabrication process, it can be fabricated very simply and conveniently.

It shall be noted that all of the first support body, the second support body, the third support body, the fourth support body, the fifth support body, the sixth support body, and the assisting support body in the respective embodiments above relate to particular embodiments of the support body included in the support structure. In one embodiment, the support structure can include only one support body, or can include a plurality of support bodies, where each support body traverses the bent section of the flexible substrate, and the shapes of the respective support bodies may vary from one to another; and in a real application, the number, positions, shapes, and other setting aspects of the support bodies can be determined dependent upon the number and positions of the bent sections of the flexible substrate, the distribution of the peripheral area of the flexible substrate, and other factors.

Furthermore the flexible substrate in some embodiments of the invention can be embodied in a number of shapes, but may not be limited thereto. For example, the flexible substrate in the respective embodiments of the invention can be quadrate, trapeziform, polygonal, or circular. Moreover the shape of the support body in the support structure may vary with the varying shape of the flexible display screen, and the varying division of the shape-varying flexible display screen into the functional area and the peripheral area. For example, if the flexible display screen is quadrate, then the support structure may include the support body arranged on the edge of the flexible display screen, and at this time, the support body can be shaped in a strip; if the flexible display screen is circular, then the support body arranged on the edge of the flexible display screen may be shaped in an arc; and if the flexible display screen is a structured in a polygon, and the bent section of the flexible substrate may run through a corner of the polygon, then the support body arranged on the edge of the flexible display screen may be structured in a V-like shape.

The number, positions, shapes, and other particular setting aspects of the support structure in the flexible display screen according to some embodiments of the invention may be described below by way of an example in which the flexible display screen according to some embodiments of the invention is a quadrate display screen.

Figure 13:
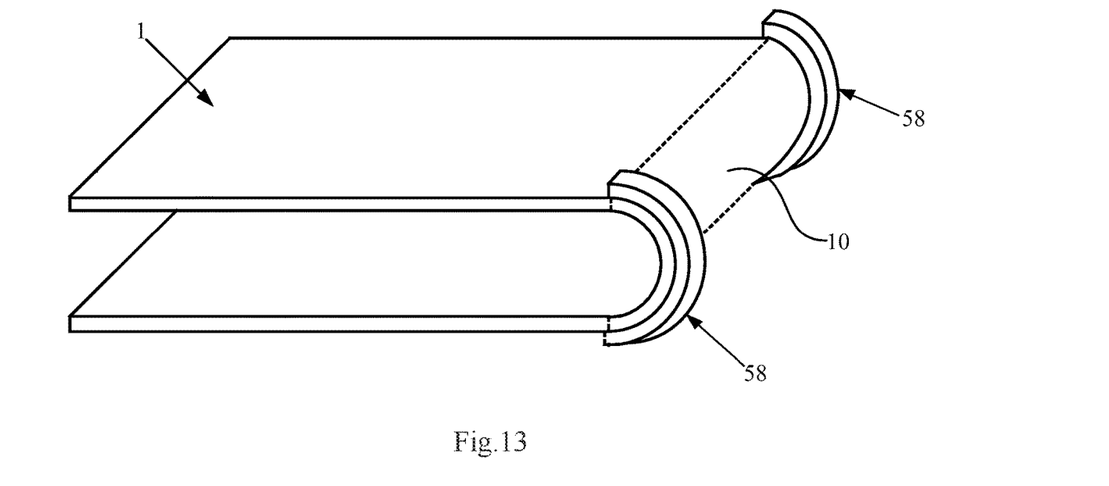
FIG. 13 is a schematic structural diagram of a flexible display screen according to a first embodiment of the invention which is folded in an implementation thereof.
Figure 14:
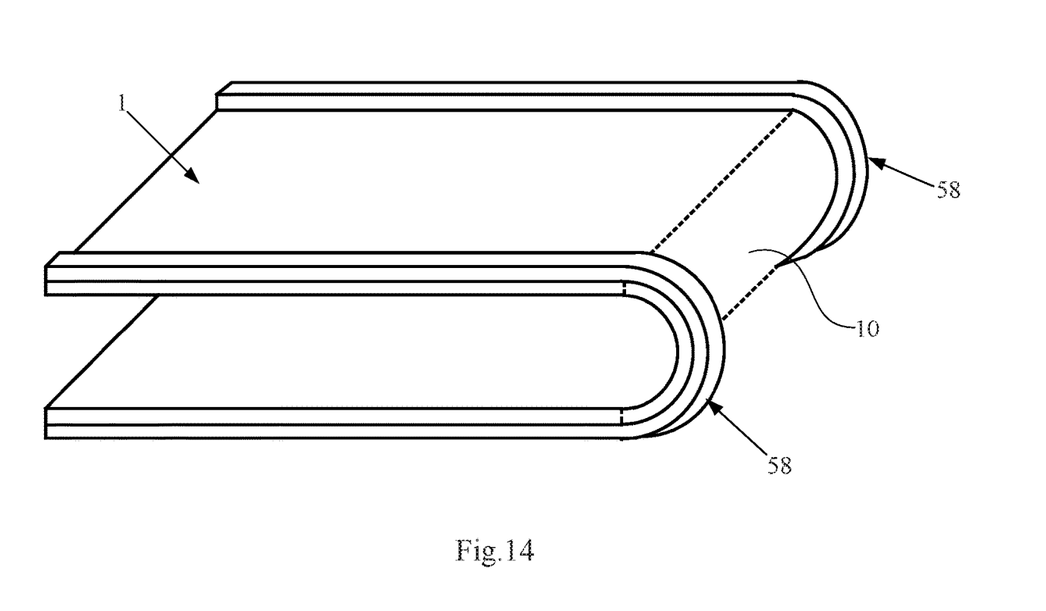
FIG. 14 is a schematic structural diagram of a flexible display screen according to the first embodiment of the invention which is folded in another implementation thereof.

In a first embodiment, as illustrated in FIG. 13 and FIG. 14, the support structure includes at least one strip-like support body 58 arranged on the edge of the flexible substrate 1, and traversing the bent section 10 of the flexible substrate 1; and as illustrated in FIG. 3, FIG. 4, FIG. 6, and FIG. 8, for example, all of the first support body 51 located on the edge of the wiring area, and the third support body 53 and the fourth support body 54 located on the edge of the display area can be arranged in the same shape and at the position as the strip-like support body 58, that is, all of them can be included in the strip-like support body 58.

In one embodiment, as illustrated in FIG. 13 and FIG. 14, the support structure can include two strip-like support bodies 58 arranged respectively on two opposite edges of the flexible substrate 1, that is, the strip-like support bodies 58 arranged respectively on two edges of the flexible substrate 1 in the extension direction of the bent section 10; and in a particular embodiment, as illustrated in FIG. 13, the length of the strip-like support bodies 58 can exactly traverse the bent section 10, that is, the length thereof is equivalent to the width of the bent section 10. In another particular embodiment, as illustrated in FIG. 14, the length of the strip-like support bodies 58 can be equivalent to the length of the edges of the flexible substrate 1 where they are located.

Figure 16:
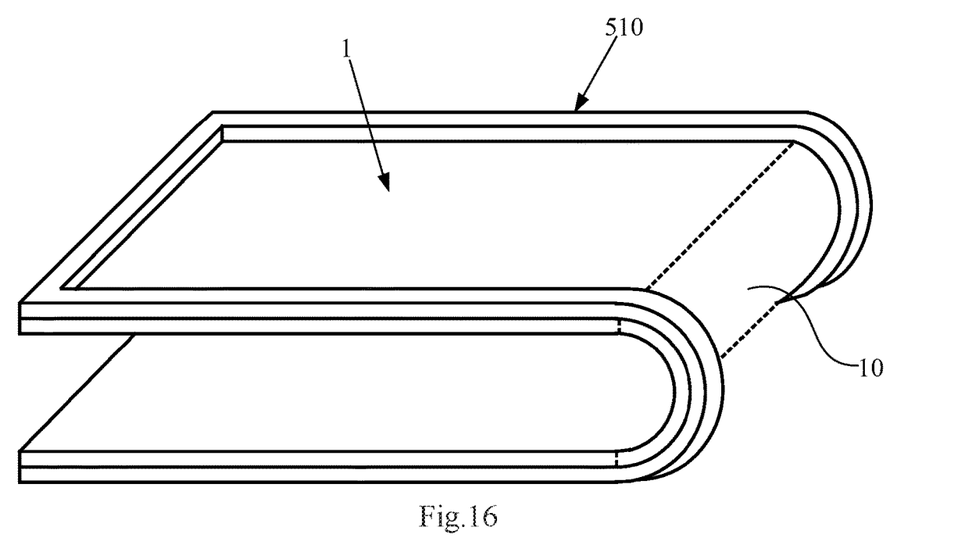
FIG. 16 is a schematic structural diagram of a flexible display screen according to a second embodiment of the invention which is folded.

In a second embodiment, as illustrated in FIG. 16, the support structure can include a support body 510 arranged in a closed ring on the edge of the flexible substrate 1; and since the support body 510 surrounds the entire functional area of the flexible substrate 1, no matter how many bent sections 10 are included in the flexible substrate 1, and in which direction each bent section 10 is bent, the ring-like support body 510 can traverse the respective bent sections 10 to thereby support the respective bent sections 10.

Figure 15:
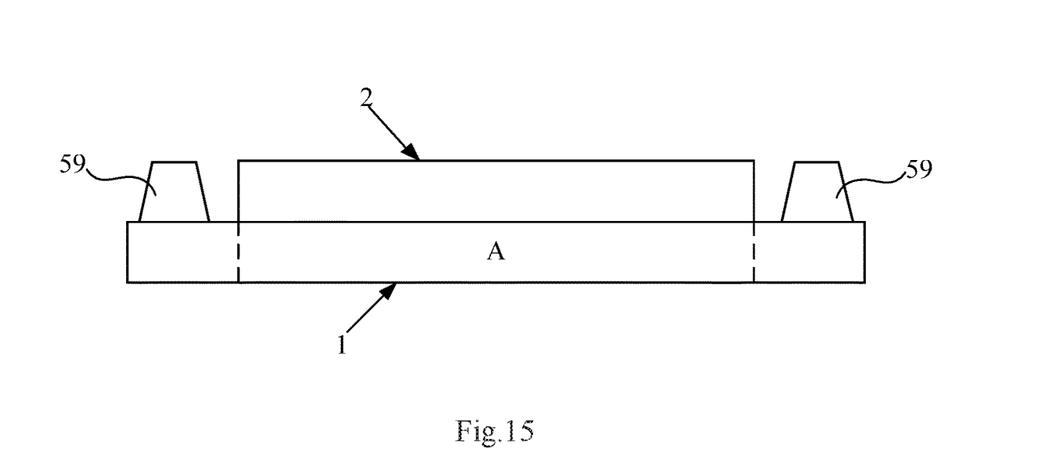
FIG. 15 is a schematic structural diagram of a cross section of a flexible display screen according to the first embodiment of the invention in the extension direction of a bent section.

In one embodiment, the support body in the respective embodiments above, e.g., the strip-like support body 58 in the first embodiment, and the ring-like support 510 in the second embodiment has a cross section which can be rectangular, quadrate, triangular, semicircular, a section, undee, trapeziform, etc. For example, FIG. 15 illustrates a strip-like support body 59 arranged on the edge of the flexible substrate 1, and with a cross section shaped in a trapezium with equal sizes. Of course, the shape of the cross section of the support body in FIG. 15 only relates to a particular embodiment thereof, but is not intended to limit the shape of the cross section of the support body in some embodiments of the invention thereto. In a real application, the shape of the cross section of the support body may be set as may be necessary in practice.

Figure 17:
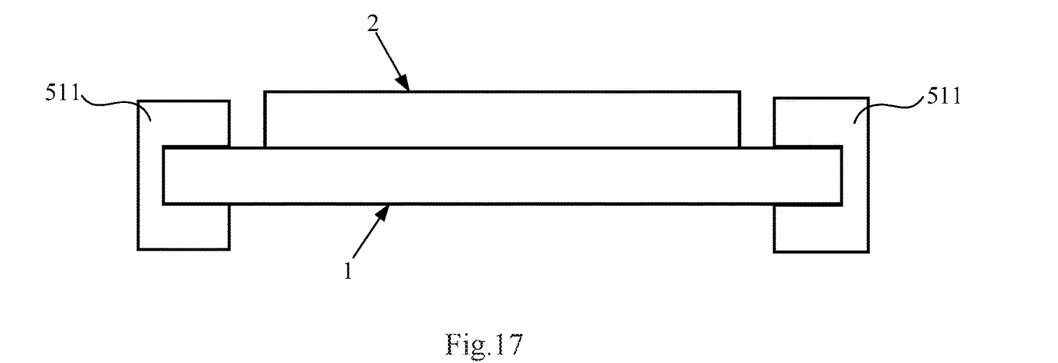
FIG. 17 is a schematic structural diagram of a cross section of a flexible display screen according to a third embodiment of the invention in the extension direction of a bent section.

In a third embodiment, as illustrated in FIG. 17, the support structure can include a support body 511 enwrapping the edge of the flexible substrate 11, that is, the cross section of the support body 511 is ⌐-shaped; and the support body 511 can be arranged surrounding the flexible substrate 1 in a structure similar to the frame of the flexible substrate 1. In one embodiment, if the support body 511 is arranged surrounding the flexible substrate 1, then like the first implementation of the first embodiment, at this time, no matter how many bent sections are included in the flexible substrate 1, and in which direction each bent section is bent, the ring-like support body 511 can traverse two ends of the respective bent sections to thereby support the respective bent sections.

In a fourth embodiment, the support structure can include a support body located on the side of the flexible substrate on which the functional elements are formed, and a support body located on the side of the flexible substrate away from the functional elements.

Figure 18:
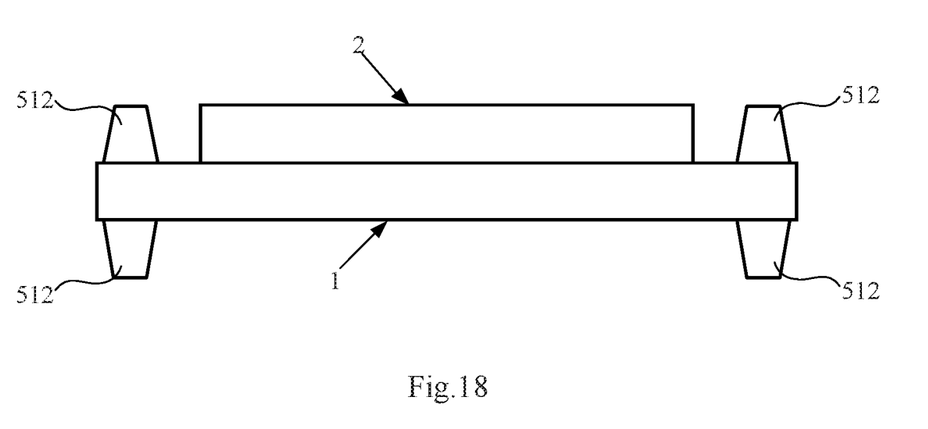
FIG. 18 is a schematic structural diagram of a cross section of a flexible display screen according to a fourth embodiment of the invention in the extension direction of a bent section.

In a first implementation, as illustrated in FIG. 18, the support structure can include at least two support bodies 512 arranged respectively on two sides of the flexible substrate 1 (i.e., the side of the flexible substrate 1 on which the display function film layer 2 is formed, and the side of the flexible substrate 1 away from the display function film layer 2), and the at least two support bodies 512 are distributed symmetrically on the two sides of the flexible substrate 1. In one embodiment, each support body 512 is shaped in a strip, and has a cross section shaped in a trapezium with equal sizes.

In a second implementation, as illustrated in FIG. 12, the support structure includes a film layer 50 structure located on the side of the flexible substrate 1 on which the display function film layer 2 is formed, and generated at the same time with the organic film layer in the display function film layer 2; and an assisting support body 57 located on the side of the flexible substrate 1 away from the display function film layer 2, where the assisting support body 57 and the film layer 50 are stacked in the direction perpendicular to the flexible substrate 1.

If there are support bodies arranged on both the sides of the flexible substrate, then a stress-neutral plane of the bent section of the flexible display screen (i.e., a plane where the sum of stresses in respective directions is equal to 0; and if the flexible display screen is bent, then the stress-neutral plane of the bent section of the flexible display screen may be substantially parallel to the bent section of the flexible display screen) may be located on the flexible substrate to thereby alleviate a stress on the flexible substrate so as to avoid the flexible substrate from being damaged due to an excessive stress thereon; and if the support bodies on both the sides of the flexible substrate are arranged symmetrically, then the flexible substrate may be subjected to the least stress, so it may be the hardest to damage the flexible substrate.

Of course, as illustrated in FIG. 5, FIG. 7, FIG. 9, FIG. 10, and FIG. 15, all of the support bodies included in the support structure 5 can be located on the side of the flexible substrate 1 on which the functional elements are formed; or as illustrated in FIG. 13, FIG. 14, and FIG. 16, the all of the support bodies included in the support structure 5 can be located on the side of the flexible substrate 1 away from the functional elements.

A particular material of the support structure in the flexible display screen according to some embodiments of the invention may be described below by way of an example.

In a particular embodiment, the elastic modulus of the support body in the support structure is greater than 10 GPa, and at this time, the flexibility of the support structure is good, so that it can support the flexible substrate stably and reliably without any significant influence upon the folding and expanding performance of the flexible substrate.

In one embodiment, the support body in the support structure can be made of a metal material or an organic macromolecule material; for example, the support body included in the support structure can be a metal strip bonded on the flexible substrate, or can be an organic macromolecule material film layer formed on the flexible substrate.

In one embodiment, the support body in the support structure can be made of one or more of copper, iron, or another metal material, or one or more of polyimide, a polymethyl methacrylate-like plastic, or another organic macromolecule material, or another flexibility-enhancing composite material, and the support body in the support structure can also be a combination of more than one of the respective materials above, although the embodiment of the invention may not be limited thereto.

In another particular embodiment, the material of the support structure can be further selected, and the position thereof can be further set, so that the stress-neutral plane of the bent section of the flexible display screen is located on the side of the flexible substrate on which the functional film layers are formed, to thereby alleviate a stress on the functional film layers of the flexible substrate so as to avoid the functional film layers of the flexible substrate from being damaged or broken.

Furthermore some embodiments of the invention further provide a flexible display device including the flexible display screen according to any one of some embodiments above. For example, the flexible display device according to the embodiment of the invention can be a foldable smart mobile phone, a wearable smart watch, smart glasses, a tablet computer, a TV set, a display, a notebook computer, a digital photo frame, a navigator, an on-vehicle display, an electrophoresis display, an electronic paper, or any other product or component including a flexible display screen.

In the flexible display device, the flexible display screen is arranged therein with the support structure traversing the bent section of the flexible substrate, where the support structure can support the flexible substrate so that the bent section of the flexible substrate can be deformed uniformly and moderately while the flexible substrate is being folded and expanded, to thereby avoid the functional film layers from being damaged, or the flexible substrate from being broken due to the local significant deformation of the bent section of the flexible substrate, so the flexible display screen of the flexible display device above is highly reliable, less tends to be damaged, and has a longer service lifetime; and since the support structure above may not affect the bending performance of the flexible display screen, the flexible display screen in the flexible display device above also has good bending performance, and thus is convenient for the user to bend and carry. Moreover in the invention, the support structure traversing the bent section of the flexible substrate, and capable of being bent or expanded along with the bent section of the flexible substrate is arranged on the flexible substrate to thereby protect the bent section with using any external support component so as to make the flexible display device more light-weighted and thinner; and also for a foldable display including a display area with a larger curvature radius, the flexible substrate can be well fit no matter how it is bent, thus improving the reliability of the foldable display device.

Evidently those skilled in the art can make various modifications and variations to the invention without departing from the spirit and scope of the invention. Accordingly the invention is also intended to encompass these modifications and variations thereto so long as the modifications and variations come into the scope of the claims appended to the invention and their equivalents.

The invention claimed is:

1. A flexible display screen, comprising:
  a flexible substrate comprising a functional area in which functional elements are arranged, and a peripheral area around the functional area, wherein the flexible substrate comprises at least one bent section; and
  a support structure arranged in the peripheral area of the flexible substrate, wherein the support structure traverses the bent section, is bent or expanded along with the bent section, and supports the bent section; wherein an extension direction of the support structure is perpendicular to an extension direction of the bent section;
  wherein the functional area comprises a display area, a wiring area, and a flexible circuit board wire soldering area;
  wherein the wiring area is located between the display area and the flexible circuit board wire soldering area;

the flexible substrate comprises a first bent section which is located between the display area and the flexible circuit board wire soldering area, and traverses the wiring area; and the support structure comprises at least two first support bodies located on two sides of the wiring area in the extension direction of the first bent section;

wherein the wiring area comprises at least two sub-wiring areas arranged in the extension direction of the first bent section; and the support structure further comprises at least one second support body located between the sub-wiring areas;

wherein each of the at least two sub-wiring areas comprises at least two metal wires; each of the at least one second support body traverses the first bent section, and is bent or expanded along with the first bent section; and there is one second support body arranged between every two adjacent sub-wiring areas.

2. The flexible display screen according to claim 1, wherein an isolation area, in which no inorganic film layer is arranged, is arranged between the support structure and the functional area.

3. The flexible display screen according to claim 1, wherein the flexible substrate comprises a second bent section traversing the display area, and the support structure comprises a third support body which is located on the edge of the display area, and traverses the second bent section.

4. The flexible display screen according to claim 1, wherein the flexible display screen comprises a flexible liquid crystal display screen, an active matrix organic light-emitting diode display screen, a passive matrix organic light-emitting diode display screen, or an electronic paper display screen.

5. The flexible display screen according to claim 1, wherein the support structure comprises at least one film layer structure generated at the same time as the functional film layer of the function elements.

6. The flexible display screen according to claim 5, wherein the functional film layer comprises one or more of a buffer layer, an active layer, a gate insulation layer, a gate layer, an interlayer insulation layer, a source-drain electrode layer, a planarization layer, a passivation layer, an anode layer, a pixel definition layer, an organic light-emitting diode layer, and a thin film encapsulation layer; and the support structure comprises a film layer generated at the same time as one or more of the buffer layer, the gate insulation layer, the interlayer insulation layer, the planarization layer, the passivation layer, the pixel definition layer, and the thin film encapsulation layer, and an assisting support body stacked on the film layer.

7. The flexible display screen according to claim 1, wherein the support structure is arranged on the edge of the flexible substrate, and surrounds the functional area.

8. The flexible display screen according to claim 7, wherein the support structure enwraps the edge of the flexible substrate.

9. The flexible display screen according to claim 1, wherein the support structure comprises a support body located on a side of the flexible substrate on which the functional elements are formed, and a support body located on a side of the flexible substrate away from the functional elements.

10. The flexible display screen according to claim 9, wherein a cross section of the support structure perpendicular to the extension direction thereof is one or more of: rectangular, quadrate, triangular, and trapeziform.

11. The flexible display screen according to claim 1, wherein the support structure includes a metal material.

12. The flexible display screen according to claim 1, wherein the support structure includes an organic macromolecule material.

13. The flexible display screen according to claim 11, wherein the material of the support structure comprises one or more of copper, iron, polyimide, or a polymethyl methacrylate-like plastic.

14. The flexible display screen according to claim 1, wherein an elastic modulus of the support structure is greater than 10 GPa.

15. The flexible display screen according to claim 1, wherein the support structure comprises a support body located on a side of the flexible substrate on which the functional elements are formed.

16. The flexible display screen according to claim 1, wherein the support structure comprises a support body located on a side of the flexible substrate away from the functional elements.

17. A flexible display device, comprising a flexible display screen, wherein the flexible display screen comprises:

a flexible substrate comprising a functional area in which functional elements are arranged, and a peripheral area around the functional area, wherein the flexible substrate comprises at least one bent section; and a support structure arranged in the peripheral area of the flexible substrate, wherein the support structure traverses the bent section, is bent or expanded along with the bent section, and supports the bent section; wherein an extension direction of the support structure is perpendicular to an extension direction of the bent section;

wherein the functional area comprises a display area, a wiring area, and a flexible circuit board wire soldering area;

wherein the wiring area is located between the display area and the flexible circuit board wire soldering area;

the flexible substrate comprises a first bent section which is located between the display area and the flexible circuit board wire soldering area, and traverses the wiring area; and the support structure comprises at least two first support bodies located on two sides of the wiring area in the extension direction of the first bent section;

wherein the wiring area comprises at least two sub-wiring areas arranged in the extension direction of the first bent section; and the support structure further comprises at least one second support body located between the sub-wiring areas;

wherein each of the at least two sub-wiring areas comprises at least two metal wires; each of the at least one second support body traverses the first bent section, and is bent or expanded along with the first bent section; and there is one second support body arranged between every two adjacent sub-wiring areas.

* * * * *